United States Patent [19]

Sato

[11] 4,160,955
[45] Jul. 10, 1979

[54] COMPATIBLE AM-FM FREQUENCY DISCRIMINATOR

[75] Inventor: Takeo Sato, Kobe, Japan

[73] Assignee: Fujitsu Ten Limited, Japan

[21] Appl. No.: 857,445

[22] Filed: Dec. 5, 1977

[30] Foreign Application Priority Data

Dec. 11, 1976 [JP] Japan .................................. 51/149104

[51] Int. Cl.² .............................................. H03D 5/00
[52] U.S. Cl. ........................................ 329/2; 325/317;
325/349; 325/423; 329/103; 329/135; 329/137; 329/138
[58] Field of Search ............... 329/103, 135, 137, 138, 329/145, 2; 325/315, 316, 317, 349, 423

[56] References Cited

U.S. PATENT DOCUMENTS

| | | | |
|---|---|---|---|
| 3,667,060 | 5/1972 | Avins | 329/103 |
| 3,800,226 | 3/1974 | Close | 325/349 X |
| 3,999,138 | 12/1976 | Peil et al. | 329/2 |

*Primary Examiner*—Siegfried H. Grimm
*Attorney, Agent, or Firm*—Staas & Halsey

[57] ABSTRACT

A compatible AM-FM frequency discriminator for deriving an FM demodulated output and AFC outputs for FM and AM waves from an FM demodulator employing a quadrature detecting circuit which has connected thereto a phase shifter group composed of a series circuit of resonant circuits for AM and FM input frequencies, respectively, and a parallel circuit of AM and FM 90° phase shift circuits exhibiting substantially equal impedance values in predetermined frequency ranges, respectively.

20 Claims, 14 Drawing Figures

COMPATIBLE AM-FM FREQUENCY DISCRIMINATOR

BACKGROUND OF THE INVENTION

1. Field of the Invention

This invention relates to a compatible AM-FM frequency discriminator with which it is possible to derive not only an FM demodulated output but also an AFC (Automatic Frequency Control) output for FM signals and an AFC output for AM signals from an FM demodulator employing a quadrature detecting circuit.

2. Description of the Prior Art

Figure 1:
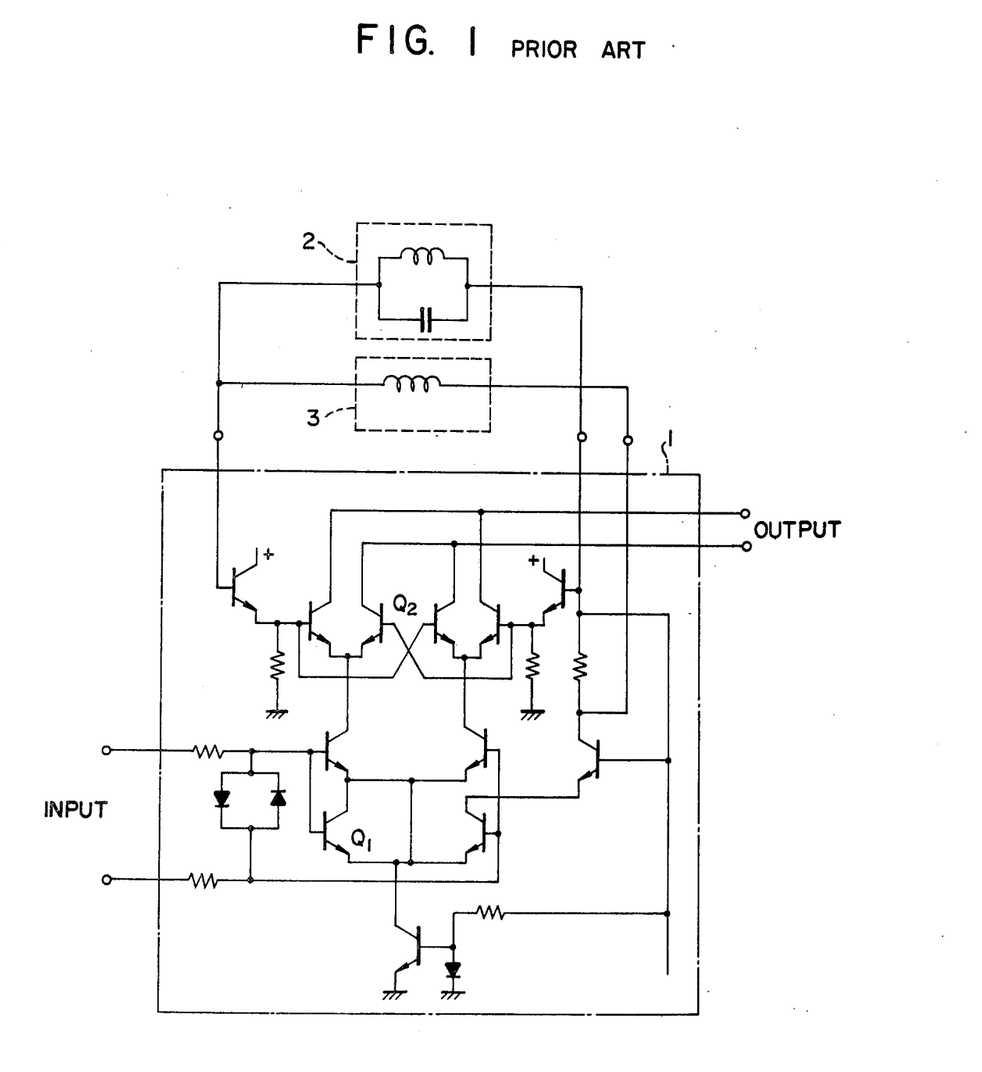
FIG. 1 is a schematic diagram of a prior art quadrature detecting circuit.
Figure 2A:
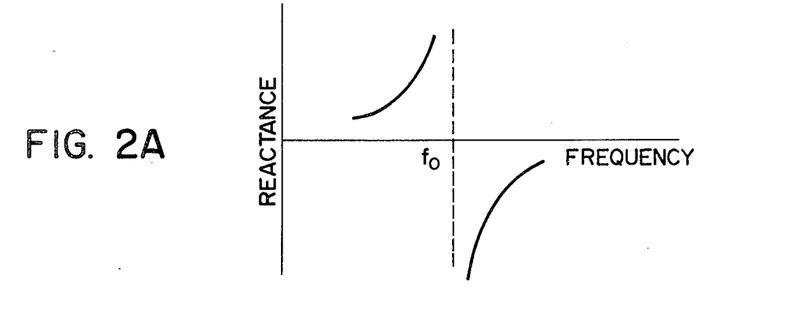
FIGS. 2A, 2B and 2C are graphs which generally explain the operation of a quadrature detecting circuit.
Figure 2B:
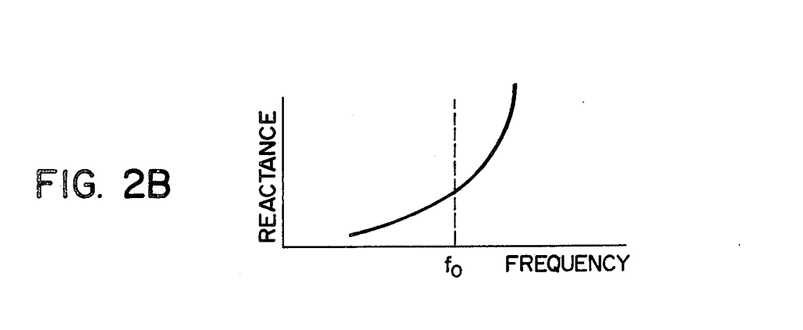
Figure 2C:
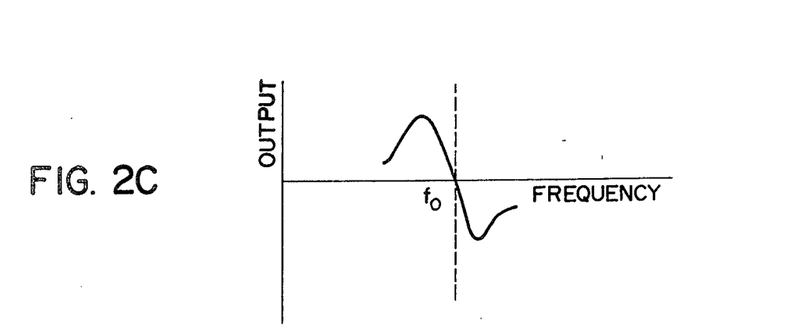

An example of a quadrature detecting circuit (hereinafter referred to as the Q detecting circuit) is shown in FIG. 1. An FM intermediate frequency input is applied to balanced differential amplifiers $Q_1$ and $Q_2$ in the Q detecting circuit 1 surrounded by the one-dot chain line. FM waves displaced in phase are produced with phase shifters 2 and 3. A demodulated output is obtained from the product of the quadrature-phased and in phase FM waves, and an AFC output can also be obtained. In this instance, the phase shifter 2 is formed with an LC resonant circuit and is tuned to an FM intermediate frequency $f_0$ to provide abrupt phase variations at the adjacent frequencies, as indicated in terms of reactance variations in FIG. 2A. The phase shifter 3 is formed, for example, with an inductor L to uniformly provide a 90° phase shift in the vicinity of the FM intermediate frequency $f_0$, as shown in FIG. 2B. With the relative phase difference between the both phase shifters, such a discriminator output as depicted in FIG. 2C is obtained to achieve frequency discrimination. In this case, the phase shifter 3 may be formed with a capacitor C in place of the inductor L but since this phase shifter is also used to provide a DC bias, the inductance L is employed in the present example. The use of the capacitor C will reverse the polarity of the discriminator. The discriminator output is usually employed not only as an FM demodulated output but also as an AFC voltage.

Figure 3:
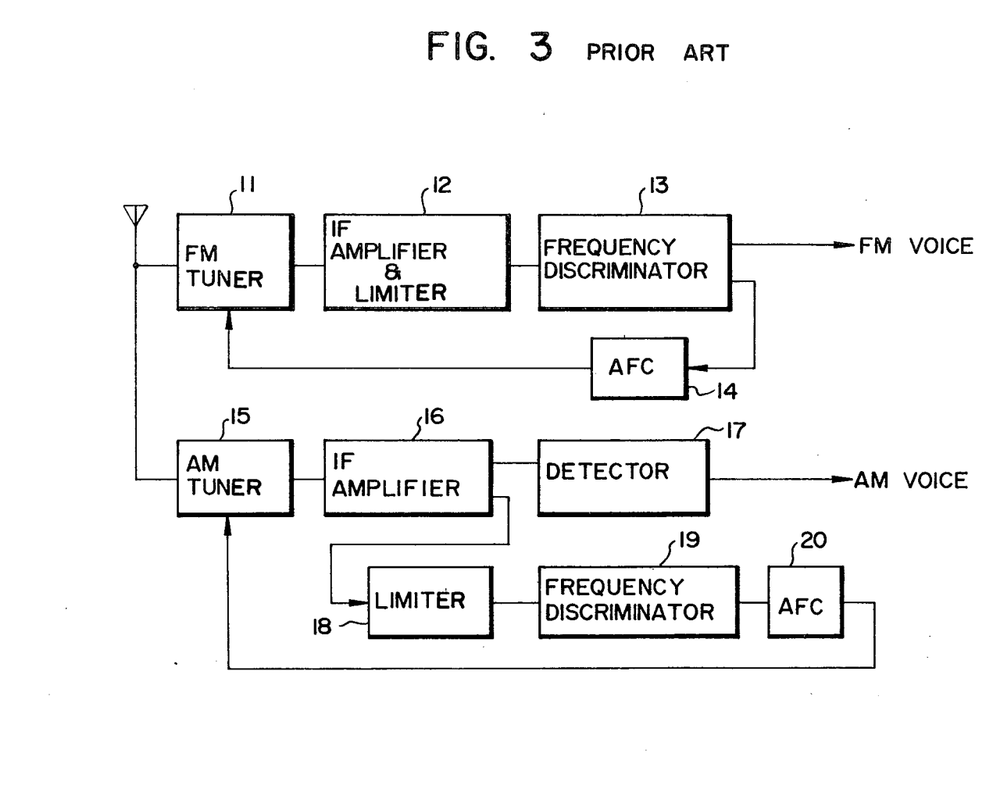
FIGS. 3 and 4 are schematic block diagrams which are explanatory of prior art examples.

Automatic frequency control which is widely employed in ordinary FM receivers, can also be used in AM receivers. Especially, in the so-called electronic tuning receiver using a semiconductor variable reactance element or the like as a tuner, both AM and FM waves are subjected to automatic frequency control in many cases. In the prior art, as illustrated in FIG. 3, FM and AM systems are provided separately of each other. In the FM system, an FM tuner 11, an IF amplifier and limiter 12, and a frequency discriminator 13 make up a demodulator to derive therefrom a voice output, and the output from the frequency discriminator 13 is fed back to the FM tuner 11 through an AFC circuit 14. In the AM system, an AM tuner 15, an IF amplifier 16 and a detector 17 constitute a demodulator to derive therefrom a voice output, and the output from the IF amplifier 16 is fed back to the AM tuner 15 through a limiter 18, a frequency discriminator 19 and an AFC circuit 20. As described above, the prior art requires special provision of a limiter and a frequency discriminator for the AM waves and, even if they are partly used in common to the FM and AM waves, the circuit structure used is complicated and is difficult to adjust.

Figure 4:
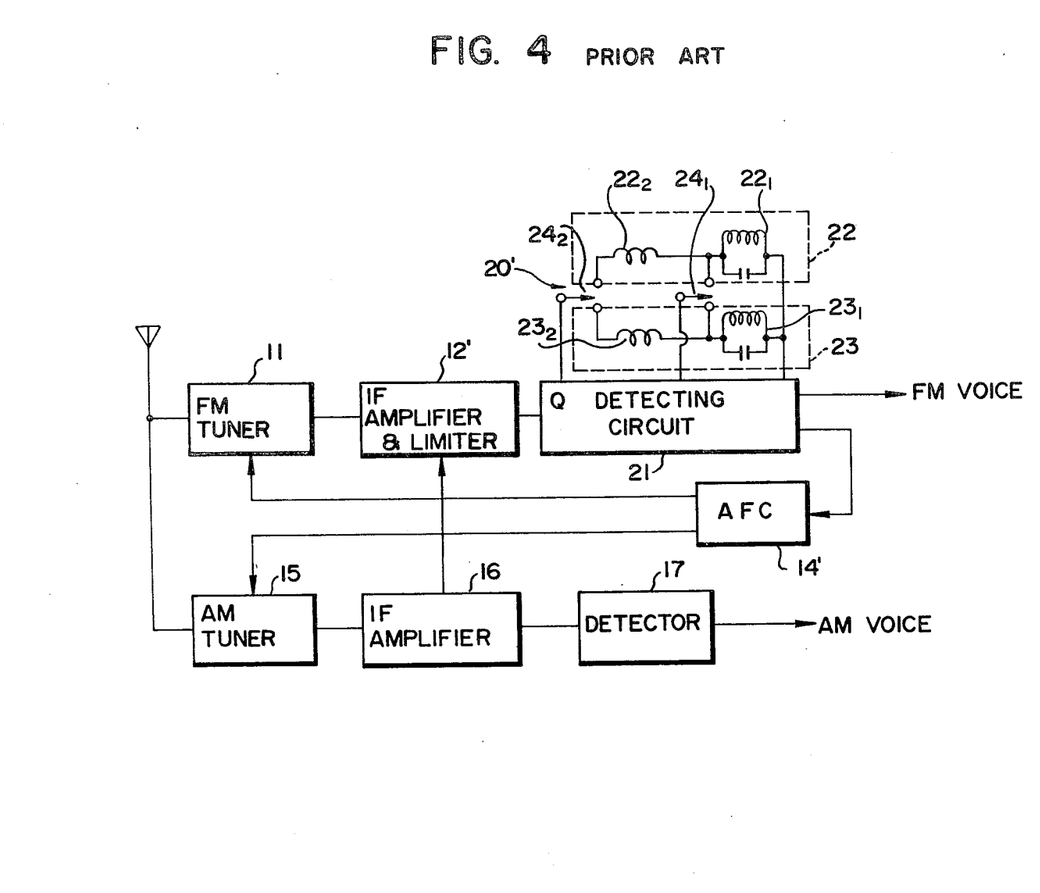

In the prior art circuit of FIG. 4, the limiter, the frequency discriminator and the AFC circuit are used in common with the FM and AM waves so as to overcome the aforesaid defects. Namely, the limiter 18, the frequency discriminator 19 and the AFC circuit 20 in FIG. 3 are left out and the branched output from the IF amplifier 16 on the AM side is applied to an IF amplifier and limiter 12' supplied with the output from the FM tuner 11. The output from the IF amplifier and limiter 12' is applied to a compatible AM-FM frequency discriminator 20', the output from which is fed back to the FM and AM tuners 11 and 15 through an AFC circuit 14'. As illustrated, the compatible AM-FM frequency discriminator 20' is designed so that a phase shifter group 22, shown in a broken-line block, is composed of a resonant circuit $22_1$ tuned to the AM intermediate frequency and a 90° phase shift circuit $22_2$ for the AM waves. Similarly, phase shifter group 23 shown in a broken-line block, is composed of a resonant circuit $23_1$ tuned to the FM intermediate frequency and a 90° phase shift circuit $23_2$ for the FM waves. Switches are used for connecting the desired phase shifter group $24_1$ and $24_2$ to Q detecting circuit 21. The above circuit construction is simple, as compared with that of FIG. 3, but involves the use of switches and has the disadvantage of increasing stray capacitance contributed by wiring, the switches, etc., which lowers the accuracy of the phase shifters.

SUMMARY OF THE INVENTION

This invention has for its object to provide a compatible AM-FM frequency discriminator which is simple in construction and highly accurate in operation.

To achieve this object, a quadrature detecting circuit is provided which has connected thereto a phase shifter group having, (1) a series circuit of a resonant circuit for an AM input frequency and a resonant circuit tuned to an FM input frequency, and (2) a parallel circuit of a 90° phase shift circuit for AM waves and a 90° phase shift circuit for FM waves. The 90° phase shift circuits present substantially equal impedance values in predetermined frequency ranges, respectively.

DESCRIPTION OF THE PREFERRED EMBODIMENTS

Figure 5:
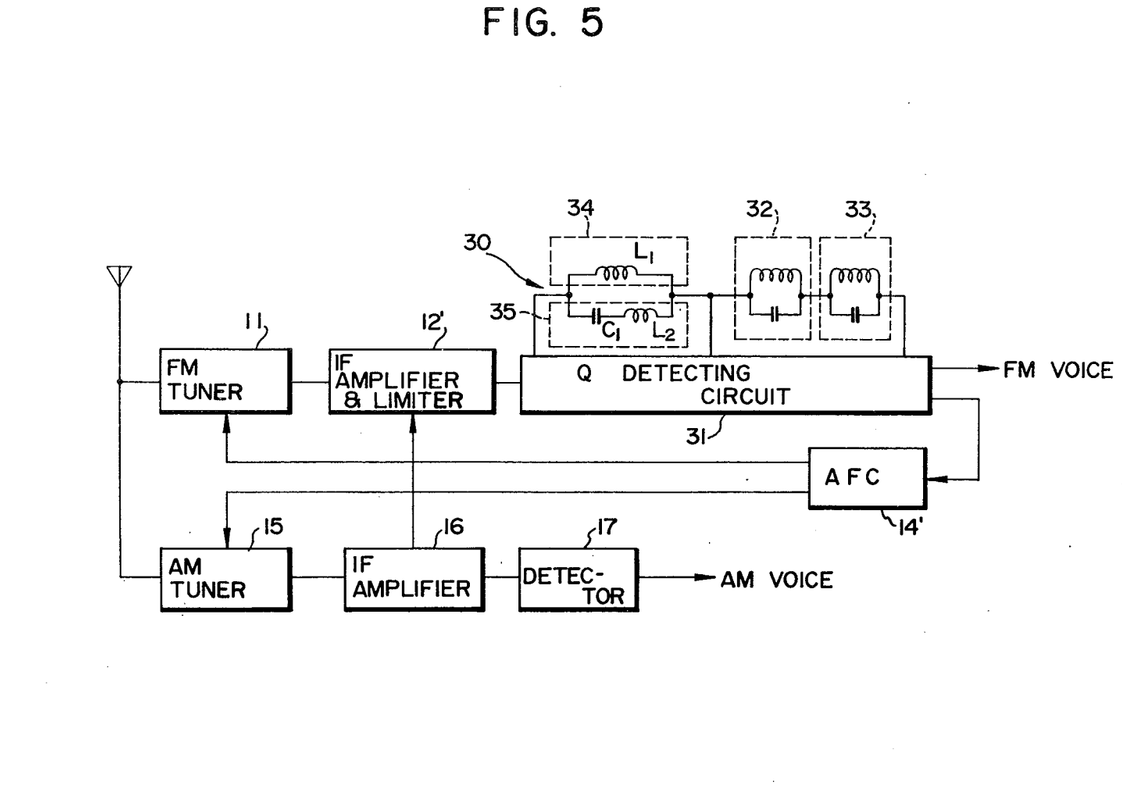
FIG. 5 is a schematic block diagram which is explanatory of the construction of an embodiment of this invention.

FIG. 5 illustrates in block diagram form an embodiment of this invention, which is identical in construction with the prior art example of FIG. 4 except for the construction of the phase shifter group of frequency discriminator 30. Q detecting circuit 31 has connected thereto a phase shifter group which comprises, (1) a series circuit of a resonant circuit 32 for the AM intermediate frequency and a resonant circuit 33 for the FM intermediate frequency, and (2) a parallel circuit of phase shift circuit 34, which provides a 90° phase shift in the vicinity of the AM intermediate frequency, phase shift circuit 35, which provides a 90° phase shift in the vicinity of the FM intermediate frequency. Resonant circuits 32 and 33 may be parallel LC circuits, as shown. Phase shift circuit 34 may be composed of an inductor $L_1$ and phase shift circuit 35 may be composed of inductor $L_2$ connected in series with capacitor $C_1$. This invention eliminates the use of switches by effectively actuating only the appropriate resonant circuit and corresponding 90° phase shifter depending on whether AM or FM is being received, and uses the fact that the AM and FM intermediate frequencies are spaced sufficiently apart from each other. The 90° phase shift circuit 35, which is composed of the inductor $L_2$ and the capacitor $C_1$, acts as a 90° phase delay circuit due to the impedance of the inductor in the vicinity of the FM intermediate frequency.

Figure 6:
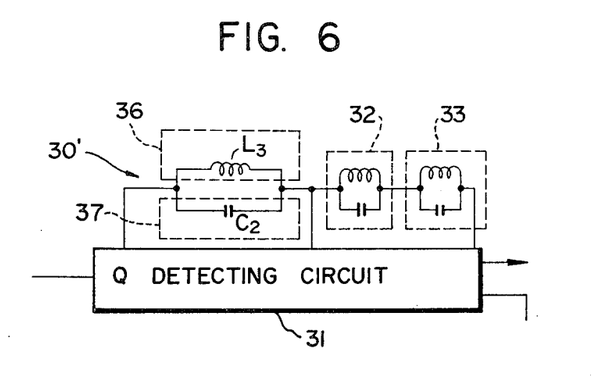
FIG. 6 is a schematic block diagram which is explanatory of the principal part of another embodiment of this invention.

FIG. 6 schematically shows the construction of the principal part of another embodiment of this invention, in which the 90° phase shift circuit 37 for the FM intermediate frequency functions as a 90° phase advance circuit, and is composed of only a capacitor $C_2$.

Figure 7A:
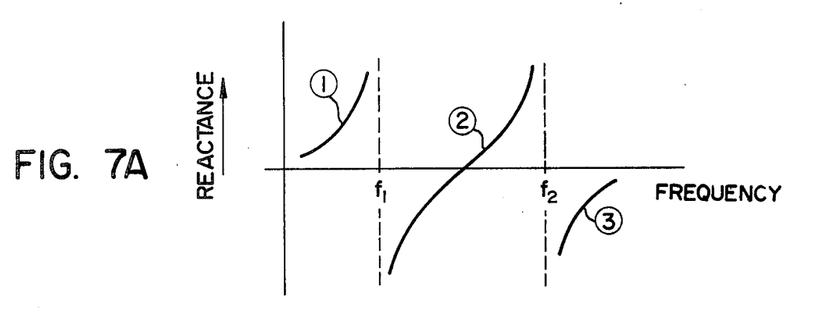
FIGS. 7A to 7C and 8A and 8B are graphs explanatory of the operation of the embodiments of FIGS. 5 and 6.
Figure 7B:
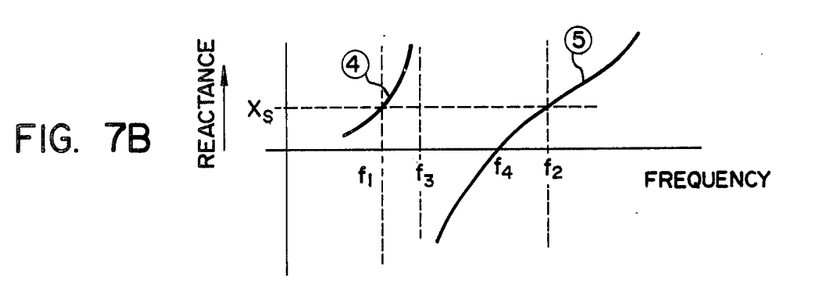

FIG. 7 shows characteristic curves explaining the operations of the embodiments depicted in FIGS. 5 and 6. FIG. 7A shows the reactance characteristics ①②and ③ of the resonant circuits 32 and 33 with respect to AM and FM intermediate frequencies $f_1$ and $f_2$ in FIGS. 5 and 6, respectively. FIG. 7B shows the reactance characteristic ④ of the 90° phase shift circuit 34 for the AM intermediate frequency $f_1$ due to the inductor $L_1$ and the reactance characteristic ⑤ of the 90° phase shift circuit 35 for the FM intermediate frequency $f_2$ due to the inductor $L_2$ and the capacitor $C_1$ in FIG. 5. Reactances $X_s$ of substantially equal absolute values are required at the respective frequencies $f_1$ and $f_2$. The capacitor $C_1$ of the 90° phase shift circuit 35 is selected to have a relatively low reactance at the FM intermediate frequency $f_2$ and a relatively high reactance at the AM intermediate frequency $f_1$ with respect to the reactance $X_s$. Accordingly, at the AM intermediate frequency $f_1$, only the inductance $L_1$ of the 90° phase shift circuit 34 is effective and is used in combination with resonant circuit 32. At the FM intermediate frequency $f_2$, since the inductor $L_1$ of the 90° phase shift circuit 34 exhibits a very high reactance, only inductor $L_2$ of the 90° phase shift circuit 35 becomes effective and is used in combination with the resonant circuit 33. Consequently, the same results as those obtainable with the switches in FIG. 4 can be obtained in the circuit of the invention, but without the use of any actual switches.

Figure 7C:
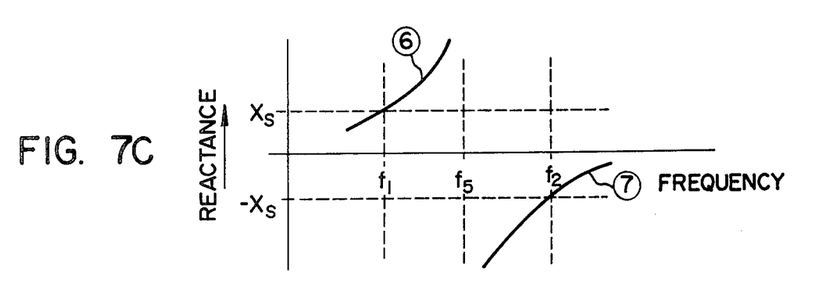

FIG. 7C shows the reactance characteristic ⑥ of inductor $L_3$ for the 90° phase shift circuit 36 of the AM intermediate frequency $f_1$ and the reactance characteristic ⑦ of capacitor $C_2$ of the 90° phase shift circuit 37 for the FM intermediate frequency $f_2$ in FIG. 6. As is the case with FIG. 7B, reactances $X_s$ of substantially the same absolute value are provided at the frequencies $f_1$ and $f_2$.

Figure 8A:
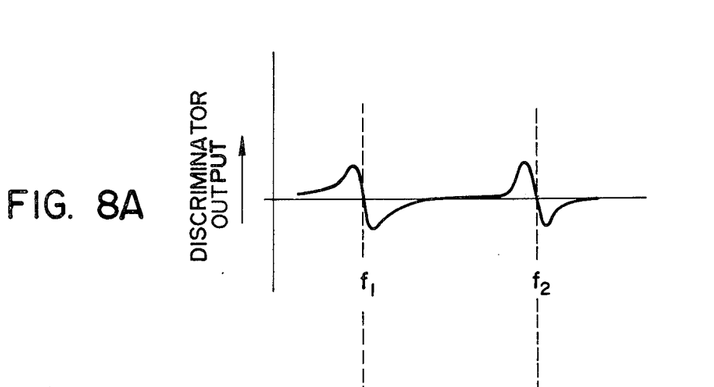
Figure 8B:
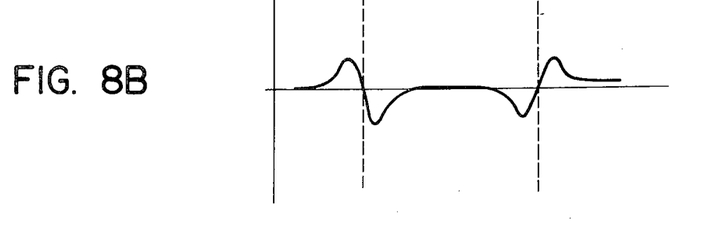

FIG. 8A illustrates the discriminator output characteristics of the FIG. 5 embodiment with respect to the AM and FM intermediate frequencies $f_1$ and $f_2$, utilizing the reactance characteristics of the resonant circuit and the 90° phase shift circuit shown in FIGS. 7A and 7B, respectively. FIG. 8B shows the discriminator output characteristics of the FIG. 6 embodiment derived from the reactance characteristics of the resonant circuit and the 90° phase shift circuit depicted in FIGS. 7A and 7C, respectively. Thus, the required discriminator output characteristics can be obtained in the neighborhoods of the AM and FM input intermediate frequencies without changing the phase shifters over by means of switches.

As is seen from a comparison of FIGS. 8A and 8B, the circuits of FIGS. 5 and 6 are different from each other only in that the discriminator outputs of the FM intermediate frequency $f_2$ are opposite in polarity. As is well-known in the art, the polarity of the AFC voltage (the direction of an increase or a decrease in local oscillator frequency to be corrected in response to a variation in the intermediate frequency) differs depending upon whether the local oscillator frequency of the receiver is set above or below the received frequency, and correct polarity is usually achieved by changing the polarity of a discriminator or a variable reactance element. However, by using the circuit of FIG. 5 for FM receivers of the type required in the United States and Europe and the circuit of FIG. 6 for FM receivers of the type required in Japan, since the local oscillator frequency is higher than the received frequency in the former and lower than the received frequency in the latter, the polarity of the automatic frequency control can be changed without changing the polarities of other circuit parts.

This is of particular utility in the case of an AM-FM electronic tuning receiver, since a variable capacitance element for such a tuner usually performs an AFC operation, too, and the polarity of the automatic frequency control cannot be changed by changing the polarity of the variable capacitance element. There is no other method but changing the polarity of the frequency discriminator, so that the circuit of FIG. 6 is convenient for an AM-FM receiver with a local oscillator frequency lower than the received frequency.

Figure 9:
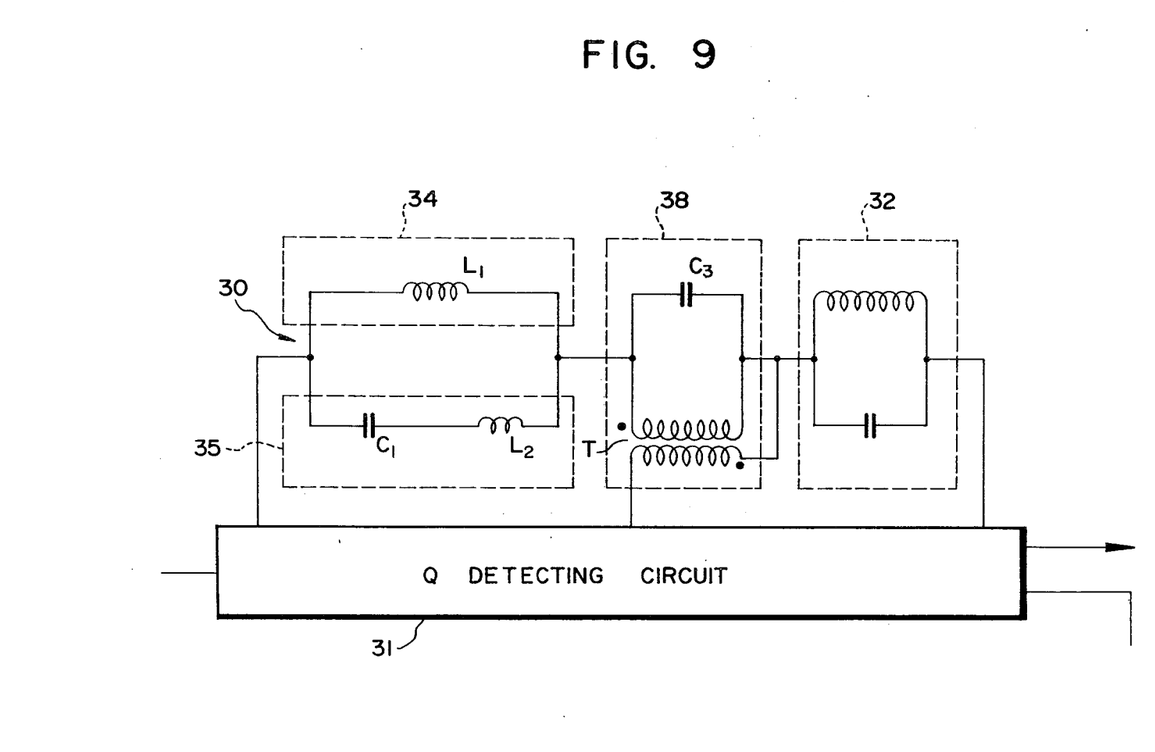
FIG. 9 is a schematic block diagram which is explanatory of the principal part of another embodiment of this invention.

The compatible AM-FM frequency discriminator for a receiver having a local oscillator frequency lower than the received frequency can also be achieved by another embodiment of this invention illustrated in FIG. 9. In FIG. 9, resonant circuit 38 tuned to the FM intermediate frequency is formed with a parallel circuit of capacitor $C_3$ and transformer T, one end of the secondary winding of the transformer T being connected to the input end of the Q detecting circuit 31. Circuits other than the resonance circuit 38 are identical with those employed in the embodiment of FIG. 5. With the circuit construction of the present embodiment, especially when receiving an FM signal, a voltage of the opposite polarity from that produced in the resonance circuit 38 is applied to the input end of the Q detecting circuit, so that the discriminator output becomes such as shown in FIG. 8B.

As has been described above, in accordance with the present invention, an AM-FM frequency discriminator can be used in common with AM and FM signals without any switches by connecting to a Q detecting circuit a phase shifter group which comprises a series circuit of resonant circuits of the AM and FM input frequencies, respectively, and a parallel circuit of 90° phase shift circuits having reactances of substantially the same absolute value for AM and FM signals, respectively. Accordingly, this invention simplifies the construction of the AM-FM discriminator and provides for enhanced reliability in its operation and, further, reduces the stray capacity resulting from wiring and switches, so that the accuracy of the phase shifter and consequently the frequency discriminator can be enhanced.

It will be apparent that many modifications and variations may be effected without departing from the scope of the novel concepts of this invention.

What is claimed is:

1. A compatible AM-FM frequency discriminator comprising:
    a quadrature detecting circuit having means for applying AM and FM intermediate frequency signals and first, second, and third means for connecting a phase shifter group; and a phase shifter group having a series circuit of resonant circuits for AM and FM intermediate frequencies, respectively, electrically connected to said first and second means, and a parallel circuit of an AM 90° phase shift circuit and an FM 90° phase shift circuit electrically connected to said second and third means, the absolute value of the reactance of said AM 90° phase shift circuit at the AM intermediate frequency being substantially equal to the absolute value of the reactance of said FM 90° phase shift circuit at the FM intermediate frequency.

2. A compatible AM-FM frequency discriminator according to claim 1, wherein the series circuit comprises a series-connected circuit composed of a single LC parallel resonant circuit for the AM intermediate frequency and a single LC parallel resonant circuit for the FM intermediate frequency.

3. A compatible AM-FM frequency discriminator according to claim 1, wherein the series circuit comprises a series-connected circuit composed of a single LC parallel resonant circuit for the AM intermediate frequency and a resonant circuit for the FM intermediate frequency, said resonant circuit for the FM intermediate frequency comprising a capacitor, one terminal of said capacitor being electrically connected to said first means through said parallel resonant circuit for the AM intermediate frequency and the other terminal of said capacitor being electrically connected to said third means through said parallel circuit of an AM 90° phase shift circuit and an FM 90° phase shift circuit, and a transformer having primary and secondary windings, said primary winding being connected in parallel with said capacitor, one terminal of said secondary winding being electrically connected to said second means and the other terminal of said secondary winding being electrically connected to said first means through said parallel resonant circuit for the AM intermediate frequency.

4. A compatible AM-FM frequency discriminator according to claim 2, wherein the parallel circuit comprises a parallel-connected circuit composed of an AM 90° phase shift circuit comprising an inductor, and an FM 90° phase shift circuit comprising a series-connected circuit of an inductor and a capacitor.

5. A compatible AM-FM frequency discriminator according to claim 2, wherein the parallel circuit comprises a parallel connected circuit composed of an AM 90° phase shift circuit comprising an inductor, and an FM 90° phase shift circuit comprising a capacitor.

6. A compatible AM-FM frequency discriminator according to claim 3, wherein the parallel circuit comprises a parallel-connected circuit composed of an AM 90° phase shift circuit comprising an inductor, and an FM 90° phase shift circuit comprising a series-connected circuit of an inductor and a capacitor.

7. A compatible AM-FM frequency discriminator according to claim 3, wherein the parallel circuit comprises a parallel-connected circuit composed of an AM 90° phase shift circuit comprising an inductor, and an FM 90° phase shift circuit comprising a capacitor.

8. A compatible AM-FM frequency discriminator, comprising:
    a quadrature detecting circuit having means for applying AM and FM intermediate frequency signals and first, second, and third means for connecting a phase shifter group; and
    a phase shifter group, said phase shifter group including fourth means for providing abrupt phase variations at both the AM and FM intermediate frequencies electrically connected to said first and second means, and fifth means for providing 90° phase shifts at both the AM and FM intermediate frequencies electrically connected to said second and third means.

9. The AM-FM frequency discriminator of claim 8, wherein said fifth means comprises first and second elements connected in parallel.

10. The AM-FM frequency discriminator of claim 9, wherein the absolute value of the reactance of said first element at the AM intermediate frequency is substantially equal to the absolute value of the reactance of said second element at the FM intermediate frequency.

11. The AM-FM frequency discriminator of claim 10, wherein said first element comprises an inductor and said second element comprises an inductor and a capacitor connected in series.

12. The AM-FM frequency discriminator of claim 10, wherein said first element comprises an inductor and said second element comprises a capacitor.

13. The AM-FM frequency discriminator of claim 9, wherein said fourth means comprises first and second resonant circuits connected in series.

14. The AM-FM frequency discriminator of claim 9, wherein said fourth means comprises:
    a transformer having a first winding with first and second ends and a second winding with first and second ends, said first end of said first winding being electrically connected to said second means, said first end of said second winding being electrically connected to said third means through said fifth means, and said second end of said first winding being electrically connected to said second end of said second winding;
    a capacitor, said capacitor being connected across said first and second ends of said second winding; and
    an LC resonant circuit having one end thereof electrically connected to said first means and the other end thereof electrically connected to said second end of said first winding.

15. An improved AM-FM receiver of the type wherein a single quadrature detecting circuit having means for applying AM and FM intermediate frequency signals and first, second, and third means for connecting a phase shifter group provides signals for controlling AM or FM frequencies, the improvement comprising:
    fourth means for providing abrupt phase variations at both the AM and FM intermediate frequencies, said fourth means being electrically connected to said first and second means; and
    fifth means for providing 90° phase shifts at both the AM and FM intermediate frequencies, said fifth means being electrically connected to said second and third means.

16. The improved AM-FM receiver of claim 15, wherein said fourth means comprises two LC resonant circuits connected in series.

17. The improved AM-FM receiver of claim 15, wherein said fourth means comprises:
   a transformer having a first winding with first and second ends and a second winding with first and second ends, said first end of said first winding being electrically connected to said second means, said first end of said second winding being electrically connected to said third means through said fifth means, and said second end of said first winding being electrically connected to said second end of said second winding;
   a capacitor, said capacitor being connected across said first and second ends of said second winding; and
   an LC resonant circuit having one end thereof electrically connected to said first means and the other end thereof electrically connected to said second end of said first winding.

18. The improved AM-FM receiver of claim 15, wherein said fifth means comprises first and second elements connected in parallel.

19. The improved AM-FM receiver of claim 18, wherein said first element comprises an inductor and said second element comprises an inductor and a capacitor connected in series.

20. The improved AM-FM receiver of claim 18, wherein said first element comprises an inductor and said second element comprises a capacitor.

* * * * *